United States Patent
Bains et al.

(10) Patent No.: US 6,996,749 B1
(45) Date of Patent: Feb. 7, 2006

(54) METHOD AND APPARATUS FOR PROVIDING DEBUG FUNCTIONALITY IN A BUFFERED MEMORY CHANNEL

(75) Inventors: Kuljit S. Bains, Olympia, WA (US);
Robert M. Ellis, Hillsboro, OR (US);
Chris B. Freeman, Portland, OR (US);
John B. Halbert, Beaverton, OR (US);
David Zimmerman, El Dorado Hills, CA (US)

(73) Assignee: Intel Coporation, Santa Clara, CA (US)

( * ) Notice: Subject to any disclaimer, the term of this patent is extended or adjusted under 35 U.S.C. 154(b) by 41 days.

(21) Appl. No.: 10/713,564

(22) Filed: Nov. 13, 2003

(51) Int. Cl.
*G06F 11/00* (2006.01)
(52) U.S. Cl. ........................ 714/42; 714/742
(58) Field of Classification Search ................ 714/42, 714/43, 27, 30, 32, 734, 742, 763, 37, 56, 714/743
See application file for complete search history.

(56) References Cited

U.S. PATENT DOCUMENTS

| | | | | |
|---|---|---|---|---|
| 5,931,962 A | * | 8/1999 | Dang | ........................ 714/731 |
| 5,995,424 A | * | 11/1999 | Lawrence et al. | .......... 365/201 |
| 6,182,253 B1 | * | 1/2001 | Lawrence et al. | .......... 714/718 |
| 6,646,936 B2 | * | 11/2003 | Hamamatsu et al. | ........ 365/201 |
| 6,754,117 B2 | * | 6/2004 | Jeddeloh | ..................... 365/201 |
| 2003/0026139 A1 | * | 2/2003 | Endou et al. | ............... 365/200 |
| 2003/0035328 A1 | * | 2/2003 | Hamamatsu et al. | ........ 365/200 |
| 2003/0226074 A1 | * | 12/2003 | Ohlhoff et al. | ............. 714/718 |
| 2004/0138845 A1 | * | 7/2004 | Park et al. | ................... 702/108 |

* cited by examiner

*Primary Examiner*—Nadeem Iqbal
(74) *Attorney, Agent, or Firm*—Marger, Johnson & McCollom, P.C.

(57) ABSTRACT

Some embodiments of the invention enable debugging functionality for memory devices residing on a memory module that are buffered from the memory bus by a buffer chip. Some embodiments map connector signals from a tester coupled to the high speed interface between the buffer chip and the memory bus to an interface between the buffer chip and the memory devices. During test mode, some embodiments bypass the normal operational circuitry of the buffer chip and provide a direct connection to the memory devices. Other embodiments use the existing architecture of the buffer chip to convert high speed pins into low speed pins and map them to pins that are connected to the memory devices. Other embodiments are described in the claims.

25 Claims, 6 Drawing Sheets

METHOD AND APPARATUS FOR PROVIDING DEBUG FUNCTIONALITY IN A BUFFERED MEMORY CHANNEL

BACKGROUND OF THE INVENTION

1. Technical Field of the Invention

This disclosure relates generally to memory systems, components, and methods and more particularly to a method and apparatus for providing debug functionality in a fully buffered memory channel that has no direct connection between an edge connector on a DIMM and the dynamic random access memory (DRAM) devices that reside on the DIMM.

2. Description of the Related Art

FIG. 1 is a block diagram illustrating a conventional memory channel 100 that exhibits a "stub bus" topology. The memory channel includes a host 110 and four DIMMs 120–150. Each of the DIMMs 120–150 is connected to the memory bus 115 to exchange data with the host 110. Each of the DIMMs 120–150 adds a short electrical stub to the memory bus 115. For approximately the past 15 years, memory subsystems have relied on this type of stub bus topology.

Simulations have shown that for applications of 2 to 4 DIMMs per memory channel, the stub bus technology reaches a maximum bandwidth of 533–667 MT/s (megatransactions/second), or 4.2–5.3 GB/s (gigabytes/second) for an eight byte wide DIMM. Achieving the next significant level, 800 megatransfers/second (MT/s) and beyond, will be difficult if not impossible with the stub bus topology.

DETAILED DESCRIPTION OF THE INVENTION

Figure 1:
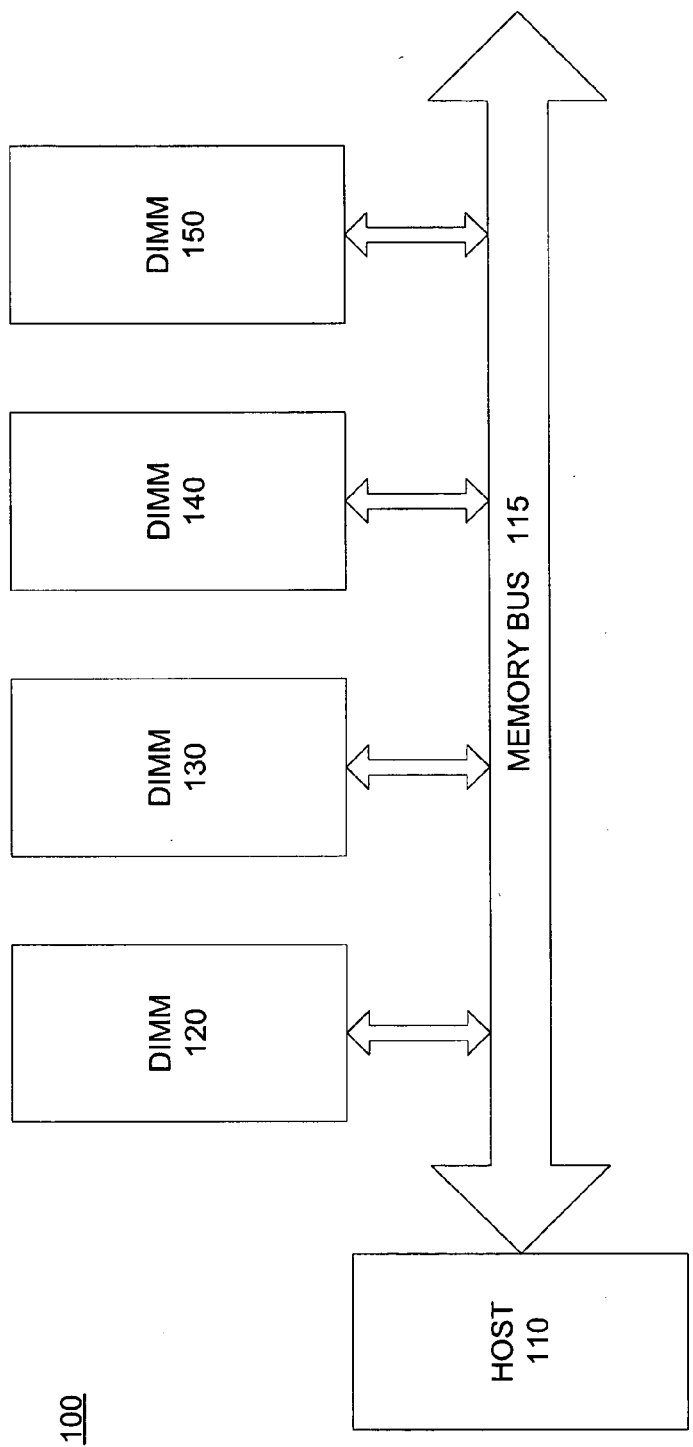
FIG. 1 is a block diagram illustrating a conventional memory channel using a "stub bus" topology.
Figure 2:
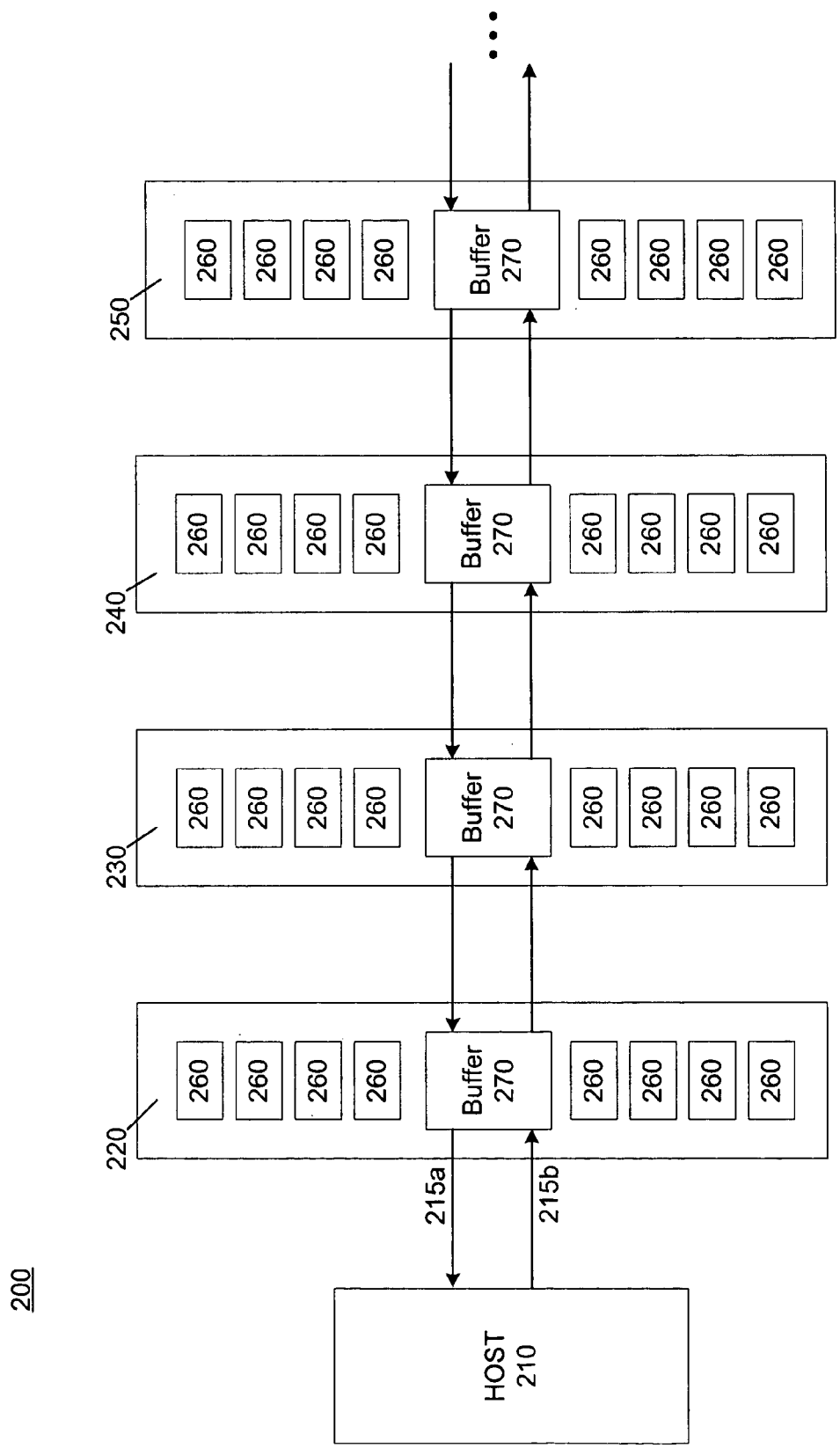
FIG. 2 is a block diagram illustrating a memory channel with a "point-to-point" topology.

In order to increase memory bandwidth requirements above 4.2–5.3 GB/s per memory channel, "point-to-point" (P2P) signaling technology has been developed. FIG. 2 is a block diagram illustrating a memory channel 200 with a P2P topology. The P2P memory channel 200 includes four DIMMs 220, 230, 240, and 250. Each of the DIMMs has eight DRAMs 260. Other P2P memory channels may have more or less DIMMs, but they will nonetheless still be arranged in the manner illustrated in FIG. 2.

The host 210 and DIMMs 220–250 are connected to a memory bus 215, where 215a represents the inbound data stream (to the host) and 215b represents the outbound data stream (from the host). In this case, the inbound data path to the DIMM 250 and the outbound data path from the DIMM 250 are not used, since DIMM 250 is the last in the chain.

The host 210 can include one or more microprocessors, signal processors, memory controllers, graphics processors, etc. Typically, a memory controller coordinates access to system memory, and the memory controller will be the component of host 210 connected directly to the inbound and outbound data paths 215a and 215b.

In the P2P configuration, each DIMM has a buffer chip 270. The buffer chips 270 capture signals from the inbound data stream 215a or outbound data stream 215b and retransmit the signals to the next buffer chip 270 on a neighboring DIMM in a daisy-chain fashion. In the case of the buffer chip 270 belonging to the DIMM 220, data is also received from and transmitted to the host 210.

The inbound and outbound data stream 215a, 215b are composed of a number of high-speed signals (not shown), where each high-speed signal is implemented by a differential pair. These point to point links allow high speed, simultaneous data communication in both directions.

Each buffer chip 270 also has a Phase-Locked Loop, or PLL (not shown). During normal operation, the buffer chip uses a clock output from the PLL. The clock output of the PLL is derived from a reference clock signal (not shown) that is supplied to the buffer chip 270.

In addition to the narrow, high-speed interface on the host side of the buffer chips 270 that was described above, there is also an interface (not shown) between the buffer chips 270 and the DRAM devices 260. In normal operation the signaling on the host side of the buffer chip 270 operates at a higher frequency and uses a different protocol than the DRAM side of the buffer chip 270.

During normal operation in the buffered P2P topology, signals transmitted by the host 210 travel on the outbound data stream 215b to the buffer chip 270 of DIMM 220. Some of the signals are destined for other DIMMs, and in that case they are retransmitted along the outbound data path 215b to DIMM 230, DIMM 240, DIMM 250, etc. Signals that are destined for DRAM devices 260 located on the DIMM 220 are sent to the appropriate DRAM device using the interface between the buffer chip 270 and the DRAM devices 260. A similar action is performed for signals destined for DRAM devices 260 that are located on DIMMs 230–250.

Signals originating from the DRAM devices 260 follow the reverse path. That is, the DRAM devices 260 transmit signals to the corresponding buffer chip 270. The buffer chip 270 then merges these signals with others that are returning to the host 210 along the inbound data path 215a.

In conventional memory channels, testers connected to the edge connectors of DIMMs have a direct link to the DRAM devices that reside on each of the DIMMs. On the other hand, in memory channels with a P2P topology, the presence of the buffer chip 270 eliminates this direct connection from the high-speed interface to the DRAM devices 260.

Consequently, the fact that the buffered P2P memory channel 200 does not have a direct path to the DRAM devices 260 from the high-speed interface due to the intervening buffer chips 270 becomes an issue where debugging is concerned.

Embodiments of the invention provide an apparatus and method for enabling debug functionality for memory devices in a buffered P2P memory channel. The general approach of some embodiments is to map connector signals from a tester that is coupled to the high-speed interface at the edge connector of a DIMM to the other side of the buffer chip 270 where the interface between the DRAMs and the buffer chip is located. Some embodiments accomplish this by bypassing the normal operating circuitry of buffer chip 270 to provide a direct connection between high speed pins and the low speed pins. In other embodiments, the general approach is to use the existing circuitry of the buffer chip 270 to connect the edge connector of the DIMM to the DRAM signals.

Figure 3:
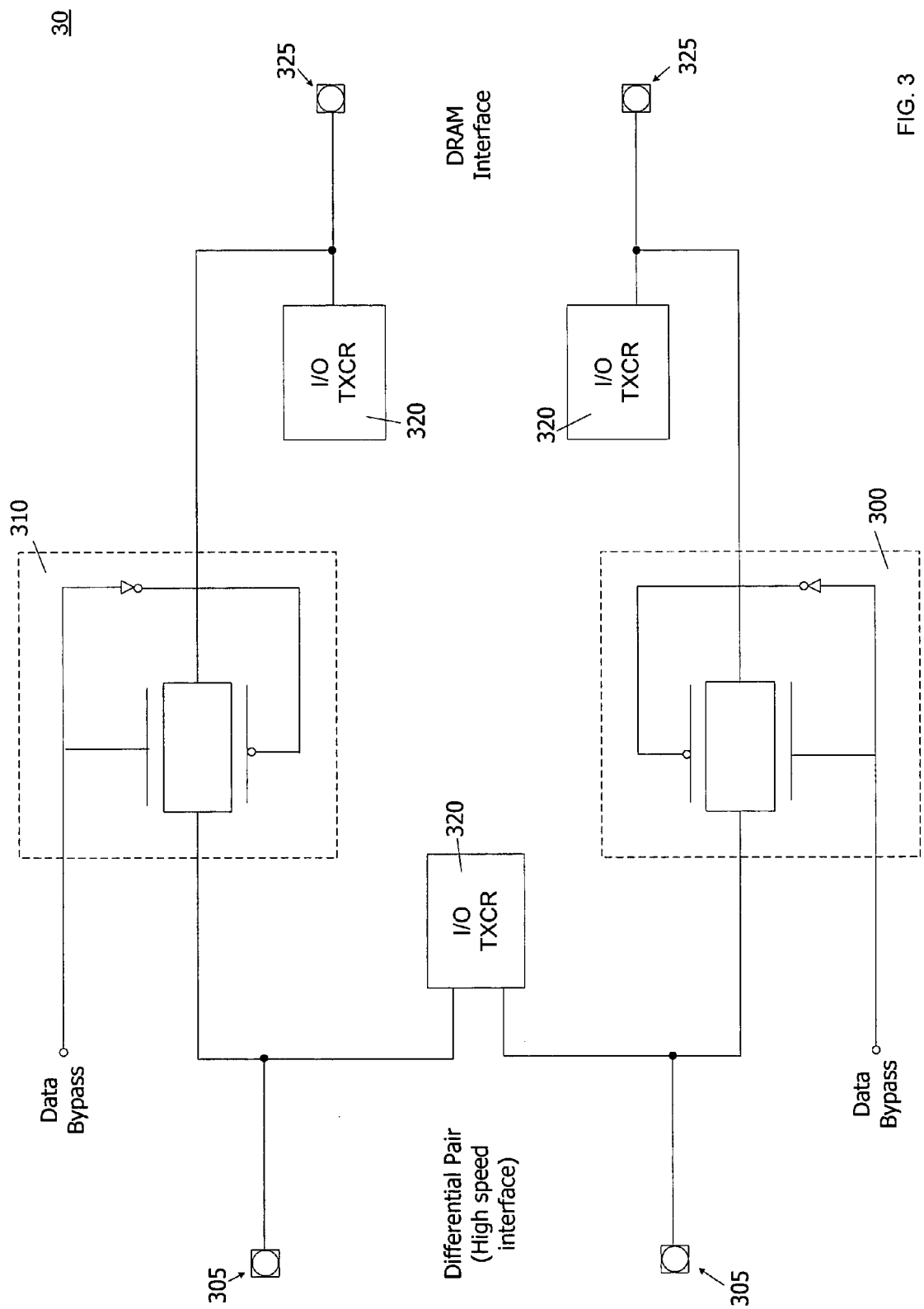
FIG. 3 is a block diagram that illustrates a data bypass circuit according to some embodiments of the invention.

FIG. 3 is a block diagram illustrating a data bypass circuit 30 according to some embodiments of the invention. The data bypass circuit 30 resides on the buffer chip 270 of FIG. 2. In these embodiments, passgates 300 and 310 are activated when the DataBypass signal is asserted, directly connecting the pins 305 of a differential pair on the high-speed interface to the pins 325 of the DRAM interface.

The I/O transceivers 320 are the normal input/output buffers that the buffer chip 270 uses during normal operation. These I/O transceivers 320 and other circuitry of the buffer chip 270 (not shown) are bypassed when the data bypass circuit 30 is activated.

Other data bypass circuits 30 according to alternative embodiments could be implemented with inverters. While inverters would have lower capacitive loading on the inputs and better drive capabilities than the passgate implementation shown in FIG. 3, this approach would require some additional direction control multiplexing for bi-directional signals.

Figure 4:
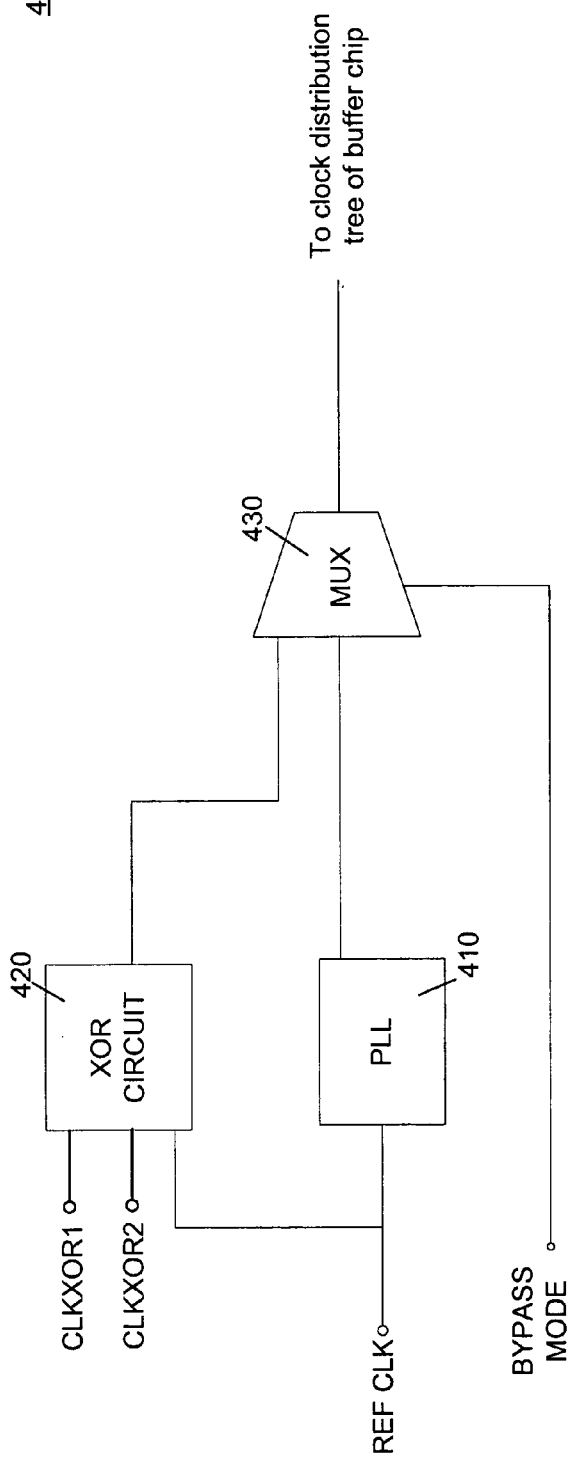
FIG. 4 is a block diagram that illustrates a PLL bypass circuit according to some embodiments of the invention.

FIG. 4 is a block diagram that illustrates a PLL bypass circuit 40 according to some embodiments of the invention. The PLL 410 is a part of the buffer circuit 270. As explained above, when the buffer chip 270 is in normal operation, the PLL 410 produces a clock signal from an external reference clock signal REF CLK. This clock signal REF CLK is subsequently supplied to other components on the buffer chip 270.

However, when the data bypass circuit 30 of FIG. 3 is activated, the regular clock output of PLL 410 is not desired. As shown in FIG. 4, an XOR circuit 420 with multiple clock inputs CLKXOR1, CLKXOR2, REF CLK is selected by MUX 430 when the Bypass Mode signal is asserted. The clock inputs CLKXOR1 and CLKXOR2 are supplied to the pins by a tester that is connected to the DIMM by the edge connector. The use of multiple clock inputs CLKXOR1, CLKXOR2, REF CLK reduces the frequency that is otherwise required by a single reference clock input. The multiple clock inputs can be combined to generate a higher frequency internal clock that is used by the buffer chip 270.

The XOR circuit 420 uses Exclusive-OR logic gates (not shown) to generate the internal clock signal. These logic gates are well-known and thus will not be described in greater detail. It is also anticipated that other combinations and types of logic gates besides XOR gates could be used to perform substantially the same function as the XOR circuit 420.

In alternative embodiments, a MUX could be arranged in the PLL bypass circuit 40 to select between the clock output of the PLL and the externally supplied clock signal REF CLK. In this configuration the PLL 410 is disabled and the reference clock is used directly in the buffer chip. The same result could be accomplished using the PLL bypass circuit 40 of FIG. 4 with the clock inputs CLKXOR1 and CLKXOR2 maintained at a constant level.

The data bypass circuit 30 illustrated in FIG. 3 and the PLL bypass circuit 40 illustrated in FIG. 4 may be used concurrently to provide a direct connection between the high-speed pins and the DRAM devices, and also to disable the clock output of the PLL. Both the Data Bypass signal of FIG. 3 and the Bypass Mode signal of FIG. 4 may be implemented either by writing to a register, by enabling a direct connect pin, or through use of the System Maintenance (SM) bus (not shown).

Figure 5:
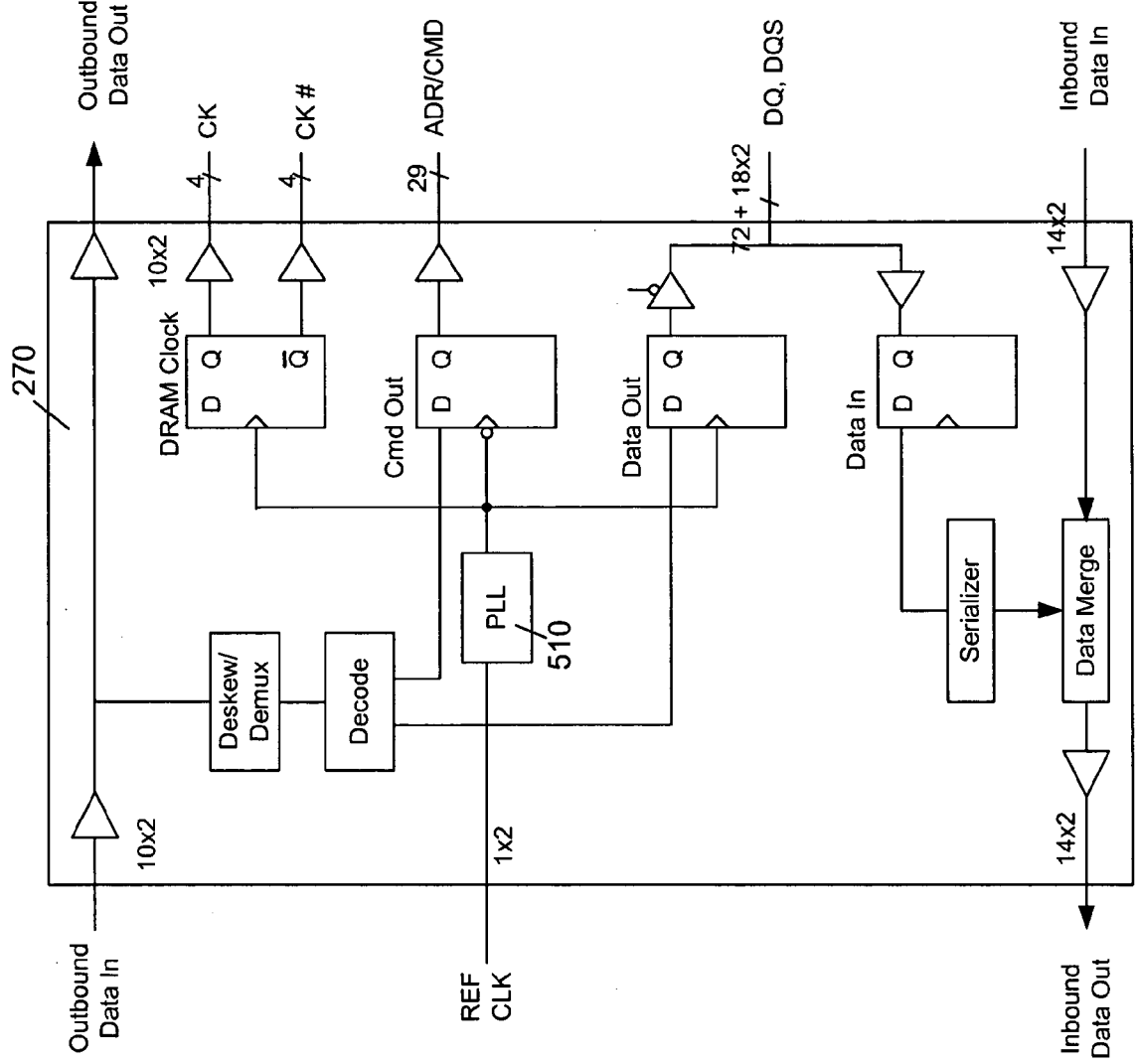
FIG. 5 is a block diagram illustrating a buffer chip of FIG. 2.

FIG. 5 is a block diagram illustrating a buffer chip 270 of FIG. 2. Reference to FIG. 5 will aid in the explanation of other embodiments of the invention, in particular, those embodiments that use the normal operating circuitry of the buffer chip 270 to provide a connection to the DRAM devices 260.

Referring to FIG. 5, the signals Outbound Data In and Outbound Data Out indicate where the outbound data path 215a of FIG. 2a travels through the buffer chip 270. The "10×2" notation indicates that this data path is composed of 10 differential signals. Similarly, Inbound Data Out and Inbound Data In represent the inbound data path 215b of FIG. 2, which is composed of 14 differential signals. The buffer chip 270 also has one differential input signal REF CLK, which is used as the external clock input.

The REF CLK signal is used as clock input for the registers DRAM Clock, Cmd Out, and Data Out. These three registers provide inputs for the DRAM devices 260 of FIG. 2. In normal operation of the buffer chip 270, address signals, command signals, and data signals are demultiplexed and decoded from the signal Outbound Data In and sent to either the CMD Out or Data Out register. The DRAM Clock register provides a total of eight clock signals to the DRAM devices with CK and CK#. The Cmd Out register provides 29 address and command signals ADR/CMD, and the Data Out register provides 72 DQ signals to the DRAM along with 18 differential DQS signals. Data sent to the buffer chip 270 from the DRAMs is received at the Data In register, after which it is serialized and merged with the Inbound Data In signal to form the Inbound Data Out signal.

Of course, the buffer chip 270 illustrated in FIG. 5 is only one possible example of a buffer chip that may be used in a P2P memory channel. Other embodiments of the invention may use buffer chips that have more or less input and output signals than the buffer chip 270. Furthermore, each DIMM may have multiple buffer chips that jointly share the burden of distributing signals to the DRAM devices located on the DIMM. Thus, still other embodiments of the invention may use multiple buffer chips to map edge connector signals to the DRAM devices.

According to other embodiments of the invention, the general approach is to use the normal operating circuitry of the buffer chip 270 to convert high speed pins into low speed pins and map them to pins of the DRAMs 260. Thus, a conventional tester (not shown) at the edge connector of the DIMM is connected to pins on the buffer chip that in normal operation would carry high-speed differential signals. For example, a typical speed for the high-speed differential signals is 4.8 GHz. On the other hand, conventional devices used to test DRAM devices on DIMMs operate at speeds on the order of 200 MHz.

Throughout the remainder of the disclosure, the operation of the buffer chip 270 while the tester is connected to it via the DIMM edge connector will be referred to as "test mode."

While in test mode, the REF CLK input pins continue to be used, but are instead driven by the tester. This allows the use of most of the existing on-chip clock distribution network for the buffer chip 270. The reference clock serves as input for the PLL circuit 510.

Furthermore, input signals from the tester are connected to a number of the pins from Outbound Data In and Inbound Data In that would otherwise carry high speed differential signals during normal operation. Outbound Data In provides 20 (10×2) input signal paths for the tester to access the buffer chip 270 and Inbound Data In provides 28 (14×2) input signal paths. Thus, there are up to 48 input connections that can be utilized by the tester.

Similarly, Inbound Data Out may provide up to 28 (14×2) output connections for the tester. Some of these output connections are configured as Pass/Fail outputs during the operation of the buffer chip 270 in test mode.

During test mode, command, address, and data signals are passed to the DRAM after introducing some internal delay in the buffer chip 270. The simplest way to accomplish this is to delay all inputs by one DRAM clock cycle, where a DRAM clock cycle is the period between two rising edges of the DRAM clock CK.

For example, data from the tester is 16 bits wide at a single data rate (SDR) of 200 MHz. On the way to the DRAM, the SDR is doubled to arrive at a double data rate (DDR), and the width is halved by clocking out 8 bits of data on the rising edge of the clock and the remaining 8 bits on the falling edge of the clock.

In these embodiments, DDR transactions between the buffer chip 270 and the DRAMs are burst oriented, reading or writing 4 words of data across 4 clock edges. Normally input data from the tester is replicated 9 times across the memory data bus, converting 8 bits of DDR input data to 72 bits of DDR data. To complete a burst operation, 8 bits of data across 4 clock edges or 32 bits of data. On the tester side of the buffer chip 270, the same 32 bits of data are transferred, but at 16 bits at a time on two rising edges of two DRAM cycles.

Alternative embodiments of the invention may use a burst transaction that reads or writes 8 words of data across 8 clock edges. Alternative embodiments of the invention may also introduce an internal delay of more than one DRAM clock cycle, for example, two DRAM clock cycles.

In test mode, the tester drives data to be written to the DRAM on a write pass and data to be compared on a read pass. The actual DRAM data and the expected data from the tester are compared in the buffer chip 270. If the actual DRAM data and the expected data differ, Pass/Fail outputs allocated from Inbound Data Out will indicate which DRAM failed. Alternative embodiments of the invention may simply pass actual DRAM data to the tester, which then performs the comparison between the actual data and the expected data.

Figure 6:
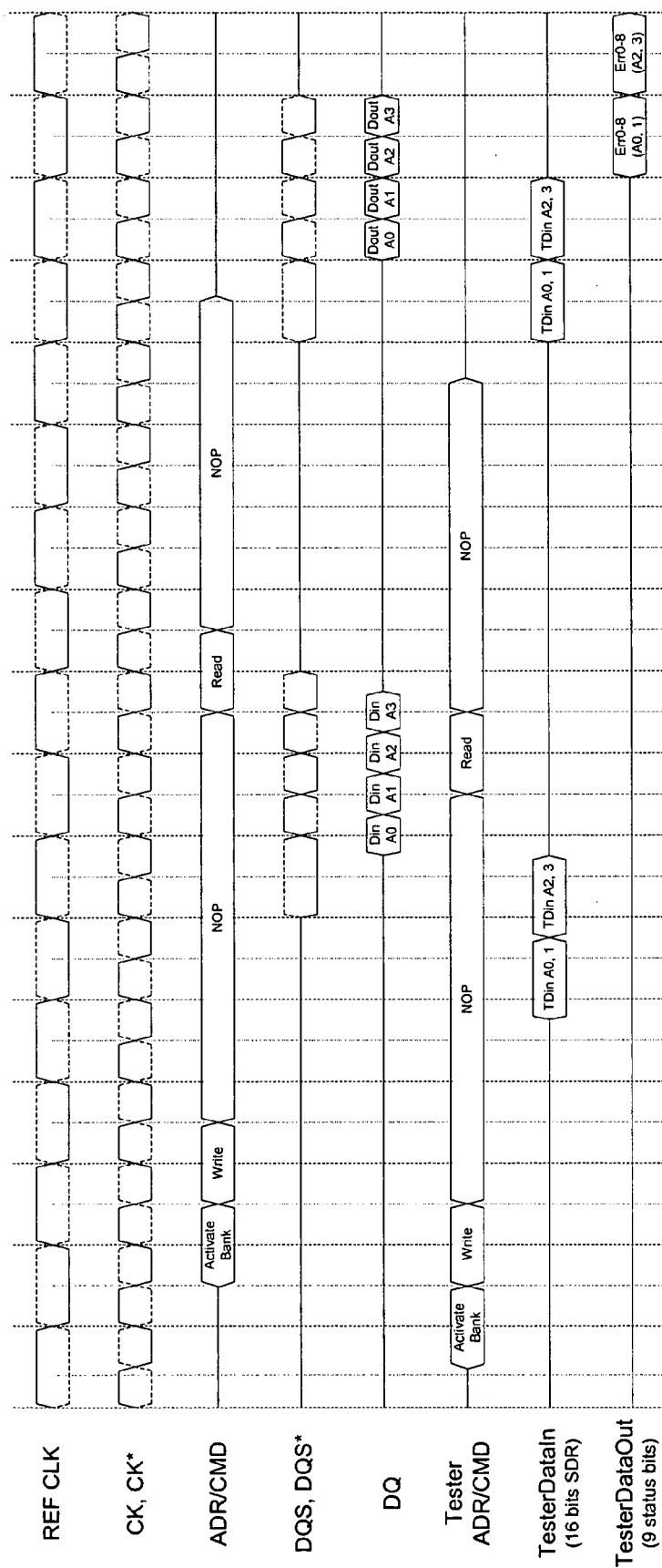
FIG. 6 is a timing diagram illustrating an example of timing for a DRAM activate, read, and write sequence according to other embodiments of the invention.

FIG. 6 is a timing diagram illustrating a DRAM activate, read, and write sequence during test mode according to other embodiments of the invention. In FIG. 6, the signals REF CLK, CK, CK*, ADR/CMD, DQS, and DQ are the same signals as those shown in FIG. 5. Additionally, signals to and from the tester are represented by Tester ADR/CMD, TesterDataIn, and TesterDataOut. In this example, the tester drives REF CLK at 100 MHz. REF CLK is then converted by the internal PLL 510 (see FIG. 5) into the outgoing signals CK and CK* at 200 MHz.

As explained above, address and command pins are connected to the tester via the high speed differential inputs. TesterDataIn is connected to a 16 bit interface.

The timing diagram of FIG. 6 illustrates the case where an internal delay of two DRAM clock cycles is imparted by the buffer chip 270. This delay is illustrated between the TesterDataIn signal at the high speed interface and the DQ signal at the DRAM interface. The "NOP" notation for these signals indicates time periods where no operation is occurring.

Having described and illustrated the principles of the invention in several exemplary embodiments, it should be apparent that the invention can be modified in arrangement and detail without departing from such principles. We claim all modifications and variation coming within the spirit and scope of the following claims.

What is claimed is:

1. A method comprising:
coupling a tester to a buffer chip that is located on a DIMM using a first set of pins on the buffer chip, the first set of pins structured to carry address, command, and data signals during a normal operation of the DIMM;
coupling a plurality of DRAM modules that are located on the DIMM to a second set of pins on the buffer chip; and
testing the plurality of DRAM modules.

2. The method of claim 1, wherein coupling the tester to the buffer chip that is located on the DIMM using the first set of pins comprises coupling the tester to a first set of pins that carries differential signals during a non-test operation mode of the buffer chip.

3. The method of claim 2, wherein testing the plurality of DRAM modules comprises:
bypassing the buffer chip.

4. The method of claim 3, wherein bypassing the buffer circuit comprises:
connecting each of the first set of pins directly to a corresponding one of the second set of pins with a switching circuit.

5. The method of claim 4, wherein the switching circuit comprises one selected from the group consisting of a passgate circuit and an inverter circuit.

6. The method of claim 5, wherein bypassing the buffer circuit further comprises:
disabling an internal clock signal generated by a phase-locked loop in the buffer chip.

7. The method of claim 2, wherein testing the plurality of DRAM modules comprises:
mapping the first set of pins to corresponding ones of the second set of pins using a circuit of the buffer chip that is used during the non-test operation mode.

8. The method of claim 7, wherein mapping the first set of pins to corresponding ones of the second set of pins comprises:
passing command, address, and data signals to the plurality of DRAM modules after introducing an internal delay in the buffer chip.

9. The method of claim 8, wherein introducing the internal delay in the buffer chip comprises introducing an internal delay of one DRAM clock cycle.

10. The method of claim 9, wherein introducing the internal delay of one DRAM clock cycle comprises:
clocking a first half of a data word from the tester to a DRAM module on a rising edge of a clock signal; and
clocking a second half of the data word to the DRAM module on a falling edge of the clock signal.

11. The method of claim 8, wherein introducing the internal delay in the buffer chip comprises introducing an internal delay of two DRAM clock cycles.

12. A memory device comprising:
a plurality of DRAM modules;
an edge connector, wherein the edge connector is configured to accommodate a DRAM tester; and
a buffer chip that includes a first set of pins coupled to the plurality of DRAM modules, a second set of pins that are coupled to the edge connector, and a switching circuit configured to couple one of the first set of pins directly to one of the second set of pins, hereby bypassing the other circuits in the buffer chip.

13. The device of claim 12, the switching circuit chosen from the group consisting of a passgate circuit and an inverter circuit.

14. The device of claim 12, the buffer chip further comprising:
a phase-locked loop circuit; and
a multiplexer configured to select from among at least two clock signals, wherein a first one of the at least two clock signals is an output of the phase-locked loop circuit.

15. The device of claim 14, a second one of the at least two clock signals comprising an input of the phase-locked loop circuit.

16. The device of claim 14, the second one of the at least two clock signals comprising an output of a logic circuit, wherein inputs of the logic circuit comprise an input of the phase-locked loop circuit and at least one additional clock input from the DRAM tester.

17. The device of claim 16, the logic circuit comprising XOR logic gates.

18. A system comprising:
a host that includes a processor;
a memory bus; and
a plurality of memory devices, the host and the plurality of memory devices connected to the memory bus in a point-to-point manner, each memory device having a plurality of DRAM devices and a buffer chip with a first interface between the buffer chip and the memory bus and a second interface between the buffer chip and the plurality of DRAM devices, the buffer chip configured to connect a first interface pin to a second interface pin during a test mode of operation.

19. The system of claim 18, the buffer chip comprising:
a switching circuit configured to directly connect the first interface pin to the second interface pin.

20. The system of claim 19, the switching circuit comprising:
a switching circuit selected from the group consisting of a passgate circuit and an inverter circuit.

21. The system of claim 18, the buffer chip comprising:
a phase locked loop circuit; and
a switch circuit configured to select one from the group consisting of an external reference clock and an output of the phase locked loop circuit.

22. A machine-readable medium, that when read, causes a machine to perform processes comprising:
establishing a signal path between an edge connector of a DIMM and a DRAM module located on the DIMM, wherein the signal path lies through a buffer chip, by connecting a first pin on the buffer chip and a second pin on the buffer chip, wherein the first pin and the second pin are normally configured to transfer data at different speeds.

23. The machine-readable medium of claim 22, wherein connecting the first pin on the buffer chip and the second pin on the buffer chip comprises:
operating a switch circuit that directly connects the first pin to the second pin.

24. The machine-readable medium of claim 23, wherein the switch circuit is one chosen from the group consisting of a passgate circuit and an inverter circuit.

25. The machine-readable medium of claim 22, wherein connecting the first pin on the buffer chip and the second pin on the buffer chip comprises:
inserting a delay that is equal to at least one DRAM clock cycle between the first pin and the second pin using a circuit on the buffer chip.

* * * * *